(12) United States Patent
Lindner et al.

(10) Patent No.: US 9,751,698 B2
(45) Date of Patent: Sep. 5, 2017

(54) DEVICE AND METHOD FOR PROCESSING WAFERS (75) Inventors: Friedrich Paul Lindner, Schärding (AT); Peter-Oliver Hangweier, Pram (AT)

(73) Assignee: EV GROUP GMBH, St. Florian am Inn (AT)

( * ) Notice: Subject to any disclaimer, the term of this patent is extended or adjusted under 35 U.S.C. 154(b) by 772 days.

(21) Appl. No.: 13/878,570

(22) PCT Filed: Oct. 5, 2011

(86) PCT No.: PCT/EP2011/067405
§ 371 (c)(1),
(2), (4) Date: Apr. 10, 2013

(87) PCT Pub. No.: WO2012/049058
PCT Pub. Date: Apr. 19, 2012

(65) Prior Publication Data
US 2013/0240113 A1    Sep. 19, 2013

(30) Foreign Application Priority Data
Oct. 15, 2010   (DE) .................. 10 2010 048 043

(51) Int. Cl.
*H01L 21/02* (2006.01)
*B65G 47/00* (2006.01)
*H01L 21/67* (2006.01)

(52) U.S. Cl.
CPC ........ B65G 47/00 (2013.01); H01L 21/02002 (2013.01); H01L 21/67173 (2013.01); H01L 21/67201 (2013.01); Y10T 156/10 (2015.01)

(58) Field of Classification Search
CPC ......... H01L 21/67201; H01L 21/67742; H01L 21/67772
USPC ................................................. 414/217, 939
See application file for complete search history.

(56) References Cited

U.S. PATENT DOCUMENTS

| 4,388,034 A * | 6/1983 | Takahashi ............... C23C 14/56 |
| | | 118/729 |
| 4,752,180 A | 6/1988 | Yoshikawa .................. 414/737 |
| 4,764,076 A * | 8/1988 | Layman ............ H01L 21/67126 |
| | | 414/217 |

(Continued)

FOREIGN PATENT DOCUMENTS

| CN | 101965241 A | 2/2011 | ............. B23K 20/00 |
| EP | 0 488 267 A2 | 6/1992 | ............. H01L 21/00 |

(Continued)

OTHER PUBLICATIONS

International Search Report for International Application No. PCT/EP2011/067405, Nov. 15, 2011.

(Continued)

*Primary Examiner* — Kaitlin Joerger
(74) *Attorney, Agent, or Firm* — Kunsner & Jaffe (57) ABSTRACT The invention relates to a device for processing of substrates, especially wafers, with at least one pretreatment module, at least one aftertreatment module and at least one primary treatment module, and the pretreatment module and the aftertreatment module can be switched as a lock for the primary treatment module, and a corresponding method for processing of substrates, especially wafers.

18 Claims, 5 Drawing Sheets

(56) References Cited

U.S. PATENT DOCUMENTS

| | | | | |
|---|---|---|---|---|
| 4,825,808 A | * | 5/1989 | Takahashi | C23C 14/568 118/715 |
| 5,044,871 A | * | 9/1991 | Davis | H01L 21/67201 118/500 |
| 5,395,474 A | * | 3/1995 | Suzuki | H01J 37/026 156/345.31 |
| 5,455,082 A | * | 10/1995 | Saito | C23C 14/566 427/248.1 |
| 5,795,399 A | | 8/1998 | Hasegawa et al. | 134/1.3 |
| 5,848,868 A | * | 12/1998 | Suzuki | H01L 21/67778 356/399 |
| 5,855,681 A | * | 1/1999 | Maydan | H01L 21/67167 118/719 |
| 5,873,942 A | * | 2/1999 | Park | C23C 16/52 118/715 |
| 5,876,497 A | | 3/1999 | Atoji | 117/85 |
| 5,900,105 A | * | 5/1999 | Toshima | C23C 16/54 118/719 |
| 6,178,361 B1 | * | 1/2001 | George | H01L 21/6719 414/217 |
| 7,226,512 B2 | | 6/2007 | Fury et al. | 134/21 |
| 7,559,730 B2 | * | 7/2009 | Song | H05K 13/0069 206/454 |
| 7,972,961 B2 | * | 7/2011 | Sugiyama | C23C 16/4405 118/719 |
| 8,244,399 B2 | | 8/2012 | Maeda et al. | 700/213 |
| 8,272,825 B2 | * | 9/2012 | Hofmeister | H01L 21/67126 414/217 |
| 8,656,858 B2 | * | 2/2014 | Schneider | C23C 18/1601 118/412 |
| 9,138,980 B2 | | 9/2015 | Broekaart et al. | B32B 38/1858 |
| 2002/0005168 A1 | * | 1/2002 | Kraus | H01L 21/67017 118/715 |
| 2002/0061245 A1 | * | 5/2002 | Hasegawa | G03F 7/70808 414/217 |
| 2003/0003767 A1 | * | 1/2003 | Kim | C23C 14/505 438/763 |
| 2004/0023466 A1 | | 2/2004 | Yamauchi | 438/401 |
| 2005/0118002 A1 | * | 6/2005 | Kasumi | H01L 21/67748 414/221 |
| 2007/0051462 A1 | | 3/2007 | Nakayama et al. | 156/285 |
| 2008/0053619 A1 | | 3/2008 | Nakayama et al. | 156/382 |
| 2009/0028672 A1 | * | 1/2009 | Yamawaku | H01L 21/67766 414/217 |
| 2010/0003110 A1 | | 1/2010 | Yokota | 414/217.1 |
| 2010/0014945 A1 | | 1/2010 | Takizawa et al. | 414/217 |
| 2010/0203676 A1 | * | 8/2010 | Theuss | H01L 21/561 438/109 |
| 2010/0215460 A1 | | 8/2010 | Watanabe et al. | 414/217 |
| 2010/0266373 A1 | | 10/2010 | George et al. | 414/225.01 |
| 2011/0001953 A1 | * | 1/2011 | Ono | G03B 27/52 355/72 |
| 2011/0209832 A1 | | 9/2011 | Tawara | 156/538 |
| 2012/0067525 A1 | | 3/2012 | Nakayama et al. | 156/382 |
| 2013/0167369 A1 | | 7/2013 | Oh et al. | 29/740 |
| 2013/0292062 A1 | | 11/2013 | Iwashita et al. | 156/750 |

FOREIGN PATENT DOCUMENTS

| | | | |
|---|---|---|---|
| EP | 0 935 279 A2 | 8/1999 | H01L 21/00 |
| JP | H04349929 A | 12/1992 | B01J 3/00 |
| JP | H0669140 A | 3/1994 | C23C 16/46 |
| JP | H09223783 A | 8/1997 | H01L 21/02 |
| JP | 2001-267237 | 9/2001 | B65G 49/00 |
| JP | 2001-351892 A | 12/2001 | H01L 21/304 |
| JP | 2004-157452 | 6/2004 | B05D 7/24 |
| JP | 2007-065521 | 3/2007 | G02F 1/13 |
| JP | 2008-10670 A | 1/2008 | H01L 21/677 |
| JP | 2010212638 | 9/2010 | H01L 21/02 |
| WO | WO2010/058481 | 5/2010 | B23K 20/02 |
| WO | WO 2010/058481 A1 | 5/2010 | B30B 15/02 |
| WO | WO 2010058481 A1 * | 5/2010 | H01L 21/00 |

OTHER PUBLICATIONS

Office Action issued in connection with European Patent Application No. 13174234.8, dated Oct. 6, 2016.

Japanese Office Action issued in connection with corresponding Japanese Patent Application No. 2013-533151, dated Jun. 13, 2016.

Office Action received in corresponding Japanese Patent Application No. 2013-153406 dated Apr. 7, 2014.

Office Action (dated Sep. 18, 2014) issued in connection with corresponding European Patent Application No. 11 764 566.3.

* cited by examiner

DEVICE AND METHOD FOR PROCESSING WAFERS

FIELD OF THE INVENTION

The invention relates to a device for processing of substrates or substrate pairs, especially wafers as wafer pairs and a corresponding method.

BACKGROUND OF THE INVENTION

Process systems or process devices of semiconductor technology are generally of modular structure. They conventionally consist of different chambers in which various process steps are carried out. Thus, for example for pretreatment of wafers, process steps such as wet cleaning, plasma treatment, etching or heating can be used, while for primary treatment of a wafer, bonding, lacquering, imprinting, embossing and exposure are possible. In known process systems the wafers or wafer stacks are transported with cassettes between the process systems or modules of process systems.

During transport, the contamination, damage, fouling or oxidation and thus influencing of other process steps can occur.

Contamination of the primary treatment chambers between treatments of successive wafers, therefore in loading and unloading of wafers, is also a problem.

Furthermore it is critical with respect to time that in the primary treatment large pressure differences from atmospheric pressure as far as very low pressures of $10^{-6}$ bar or less must be overcome.

SUMMARY OF THE INVENTION

The object of this invention is therefore to optimize the processing of substrates both in terms of the sequence, and also to avoid contamination, damage, fouling or oxidation as much as possible.

This object is achieved with the features of the independent claims. Advantageous developments of the invention are given in the dependent claims. All combinations of at least two of the features given in the specification, the claims and/or the figures also fall within the framework of the invention. At the given value ranges, values within the indicated limits will also be disclosed as boundary values and will be claimed in any combination.

The invention is based on the idea of coupling a primary treatment module to at least one pretreatment module and at least one aftertreatment module such that at least one of the pretreatment modules and at least one of the aftertreatment modules and/or the primary treatment module each act as vacuum-tight locks for an adjacent pretreatment module, primary treatment module or aftertreatment module. At the same time, according to the invention in one embodiment of the invention it is provided that at least one of the pretreatment modules and/or the primary treatment module and/or at least one of the aftertreatment modules can be especially exposed to pressure, a vacuum, and/or can be temperature-treated, especially can be heated independently or regardless of an adjacent module.

In this way, in spite of a flexible structure of the process system according to the device of the invention a time-optimized, even parallel processing of several substrates is provided within the device of the invention, in which based on the lock-like coupling of the individual process modules contamination, damage, fouling or oxidation by decoupling of the substrates from external effects, especially in the loading and unloading of the individual modules, is resolved.

It is especially advantageous if the primary treatment module can be loaded and unloaded exclusively via locks or a positioning system. This is achieved in the invention by there being both a pretreatment module which is coupled in the manner of a lock to the primary treatment module and also an aftertreatment module which is coupled in the manner of a lock to the primary treatment module. By this measure the generally especially critical primary treatment of the substrates or wafers which occurs under often extreme conditions does not take place at any instant of the processing nor during the loading and unloading of the primary treatment module with contact with the environment. The primary treatment module is accordingly completely decoupled from the environment so that contamination, damage, fouling or oxidation during the primary treatment of the substrates is essentially precluded. Furthermore, there is the advantage that the steps preparatory and subsequent to primary treatment can be moved into the pretreatment module and the aftertreatment module, especially at least partial exposure to pressure and/or temperature. In the primary treatment module as a result of this only a lower pressure difference and/or temperature difference than from the ambient/atmospheric pressure $p_{ATM}$ need be overcome.

According to one advantageous embodiment of the invention, it is provided that the primary treatment chamber can be switched as a lock in the loading and unloading of the substrates. Thus, when the primary treatment chamber is being loaded, at the same time aftertreatment of the substrate which has been worked beforehand in the primary treatment chamber can take place. When the primary treatment chamber is being unloaded, conversely at the same time pretreatment of the next substrate which is to be worked in the primary treatment chamber can take place in the pretreatment chamber.

In another advantageous embodiment, it is provided that the pretreatment chamber and/or the primary treatment chamber and/or the aftertreatment chamber can be heated especially separately by means of a heating apparatus. It is especially advantageous here if the pretreatment chamber and/or the primary treatment chamber and/or the aftertreatment chamber are completely heat-insulated. In this way exact temperature control is possible with heat loss as low as possible.

To the extent other correspondingly made pretreatment modules can be connected upstream to the pretreatment module as locks and/or other correspondingly made aftertreatment modules can be connected downstream of the aftertreatment module as locks, the method sequence can be further subdivided so that optimization of the passage times in the process sequence arises. Here it is conceivable that at the same time several pretreatment modules are directly coupled to one pretreatment module via lock doors. In this way time-intensive pretreatment steps can proceed parallel and accordingly staggered in time in the upstream pretreatment modules. This applies analogously to the corresponding aftertreatment modules.

By the locks being made as pressure locks and/or temperature locks it is possible to control the pressure and/or the temperature by corresponding switching of the pretreatment modules and/or the aftertreatment modules.

For loading and unloading, there is a loading and unloading apparatus, especially at least one robot arm. The latter is used for loading and unloading of the substrates into/out of the primary treatment chamber and/or the pretreatment chamber and/or the aftertreatment chamber, and for parallel handling there can be several substrates/wafers in the process sequence, and several robot arms. Thus for example in each pretreatment chamber and/or each aftertreatment chamber there can be exactly one robot arm which can engage the respectively adjacent pretreatment chamber and/or primary treatment chamber for loading and unloading of the respectively adjacent chambers when the respective lock door is opened.

According to one especially advantageous embodiment of the invention it is provided that the primary treatment chamber can be loaded at the same time from the pretreatment chamber and can be unloaded into the aftertreatment chamber and/or the pretreatment chamber and the aftertreatment chamber can be loaded at the same time via the first lock door and unloaded via the second lock door.

Other advantages, features and details of the invention will become apparent from the following description of preferred exemplary embodiments and using the drawings.

BRIEF DESCRIPTION OF THE DRAWINGS

The same reference numbers for corresponding components are provided in the figures.

DETAILED DESCRIPTION OF THE INVENTION

Figure 1A:
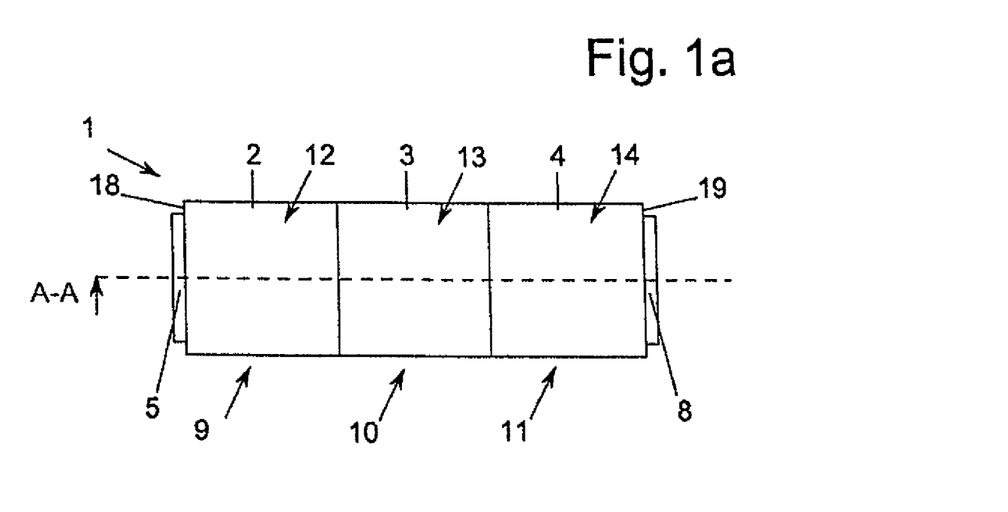
FIG. 1a shows a schematic plan view of a device as claimed in the invention with a pretreatment module, a primary treatment module and an aftertreatment module.
Figure 1B:
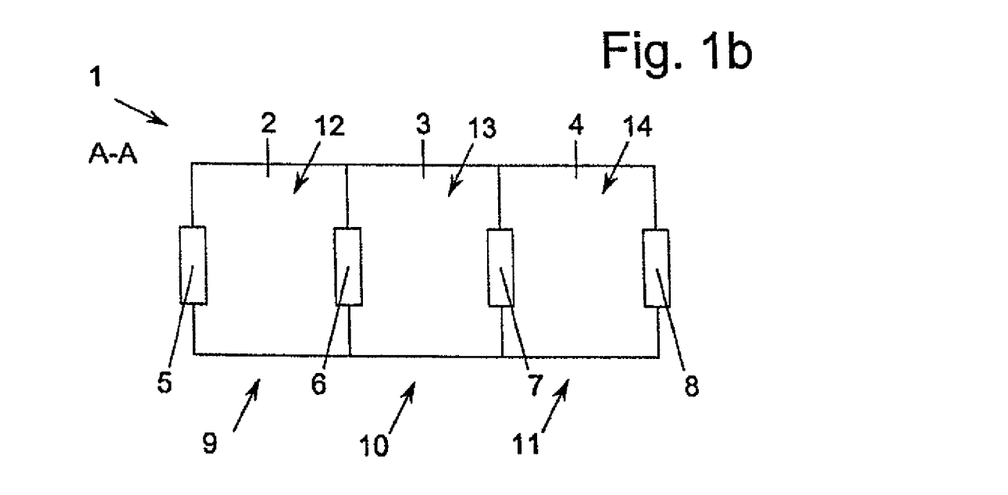
FIG. 1b shows a schematic sectional view of the device of the invention according to cutting line A-A from FIG. 1a, FIG. 2a shows a schematic plan view of a second embodiment of the device as claimed in the invention with a pretreatment module, a primary treatment module and an aftertreatment module.

In the embodiment of a device 1 of the invention shown in FIG. 1 a pretreatment module 9, a primary treatment module 10 and an aftertreatment module 11 are arranged linearly in a row.

Figure 5:
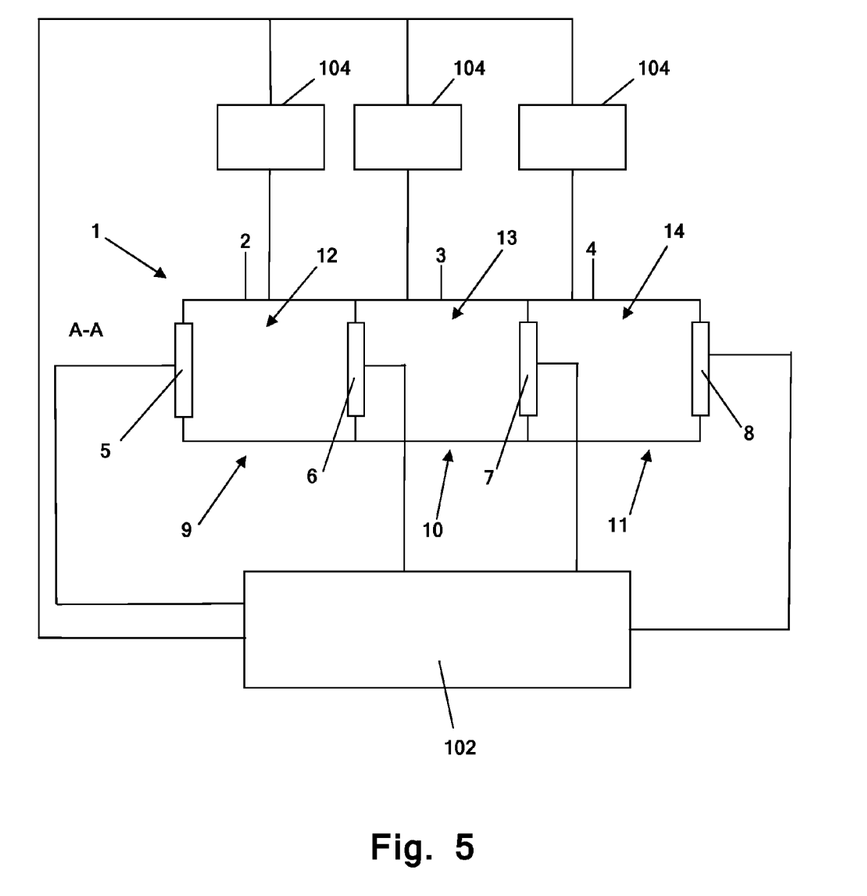
FIG. 5 shows a detailed schematic plan view of the device illustrated in FIG. 1a, wherein a pressurization apparatus and a central control apparatus are shown.

The pretreatment module 9 is comprised of a pretreatment chamber 2 which can be exposed to a vacuum and which surrounds a pretreatment space 12. A pressurization apparatus 104 is connected to the pretreatment chamber 2 and can be controlled by a central control apparatus 102 in order to be able to control the pressure in the pretreatment space 12 with the pretreatment chamber 2 closed (see FIG. 5 which provides a detailed schematic plan view of device 1). Via a temperature exposure apparatus which is not shown, the pretreatment space 12 can be heated and/or cooled, the temperature exposure apparatus being controllable by the central control apparatus 102.

Figure 4:
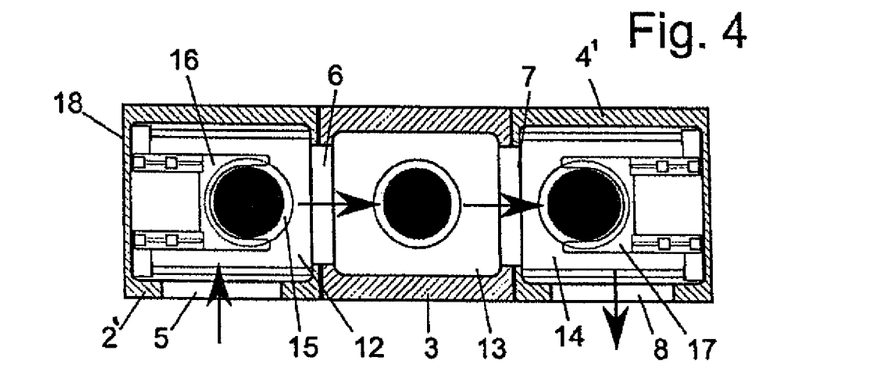
FIG. 4 shows a sectional view of the device of the invention with a pretreatment module, a primary treatment module and an aftertreatment module.

To load the pretreatment module 9 with one (or more) wafers 15, according to FIG. 4 there is a first robot arm 16. The latter, controlled from the central control apparatus 102, can be routed through a first lock door 5 when the first lock door 5 is opened. Opening and closing of the first lock door 5 are likewise controlled by the central control apparatus 102.

The first lock door 5 in the embodiment according to FIGS. 1a and 1b is located on a first face side 18 of the device 1. The first lock door 5 can be closed pressure-tight and has heat insulation so that the pretreatment space 12 in the closed state of the first lock door 5 can be pressurized.

Furthermore, the pretreatment chamber 2 opposite the first lock door 5 jointly with a primary treatment chamber 3 of the primary treatment module 10 has a first primary lock door 6. The first primary lock door 6 is made functionally analogous to the first lock door 5. The primary treatment module 10 can be coupled pressure-tight on the first primary lock door 6 to the pretreatment modules 9, as a result of which a modular structure and a replacement of individual modules 9, 10, 11 of the device 1 can be implemented.

By controlling the first lock door 5 and the first primary lock door 6 by means of the central control apparatus 102 the pretreatment module 9 can be used as a lock, specifically by the first lock door 5 being closed when the first lock door 6 is opened and vice versa.

The primary treatment module 10 is comprised of the primary treatment chamber 3 which encloses or forms a primary treatment space 13.

Opposite the first primary lock door 6 of the primary treatment chamber 3 there is a second primary lock door 7 which is included at least partially in the primary treatment chamber 3 and which is used to unload the wafer 15 from the primary treatment chamber 3 into an aftertreatment chamber 4. The second primary lock door 7 is formed at least partially by the aftertreatment chamber 4. The primary treatment space 13 can be sealed pressure-tight by the second primary lock door 7 from one aftertreatment space 14 of the aftertreatment chamber 4. Functionally the second primary lock door 7 corresponds to the first primary lock door 6, the first primary lock door 6 and the second primary lock door 7, controlled from the central control apparatus 102, forming a lock.

The aftertreatment module 11 for aftertreatment of the wafer 15 after primary treatment in the primary treatment module 10 is comprised of the aftertreatment chamber 4 which forms the aftertreatment space 14. Furthermore the aftertreatment chamber 4 has a second lock door 8 which is located opposite the second primary lock door 7.

The wafer 15 can be unloaded via the second lock door 8 and by means of a second robot arm 17 after aftertreatment out of the aftertreatment space 14 as soon as the second lock door 8 is opened.

The aftertreatment module 11 can likewise act as a lock by the second primary lock door 7 being closed when the second lock door 8 is opened and vice versa.

The second lock door 8 is located on a second face side 19 of the device 1 so that a linear movement of the wafer 15 takes place during the entire process sequence through the pretreatment module 9, the primary treatment module 10 and the aftertreatment module 11.

Figure 2A:
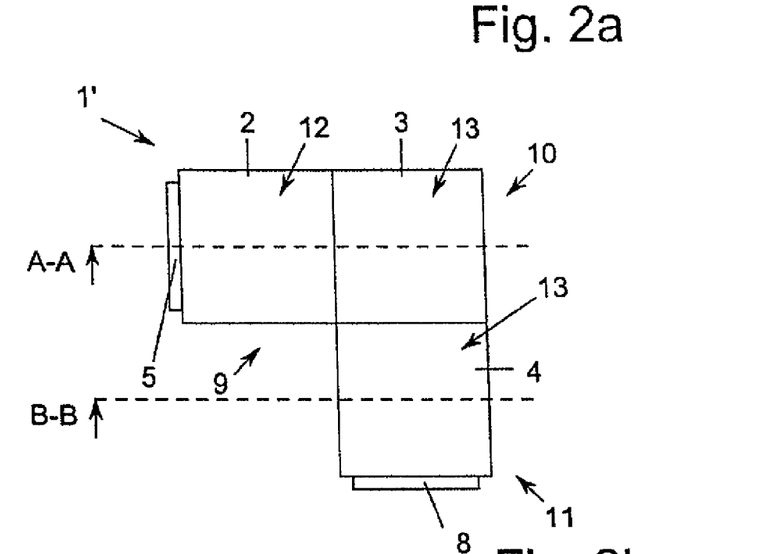
Figure 2B:
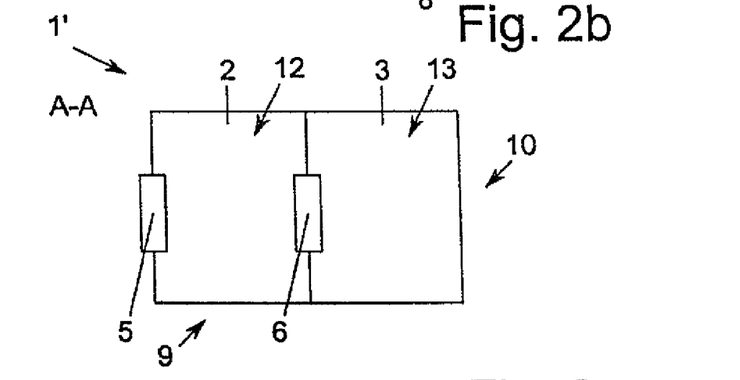
FIG. 2b shows a schematic sectional view of the device of the invention according to cutting line A-A from FIG. 2a, FIG. 2c shows a schematic sectional view of the device of the invention according to cutting line B-B from FIG. 2a, FIG. 3 shows a pressure/temperature diagram of a method of the invention for processing of substrates
Figure 2C:
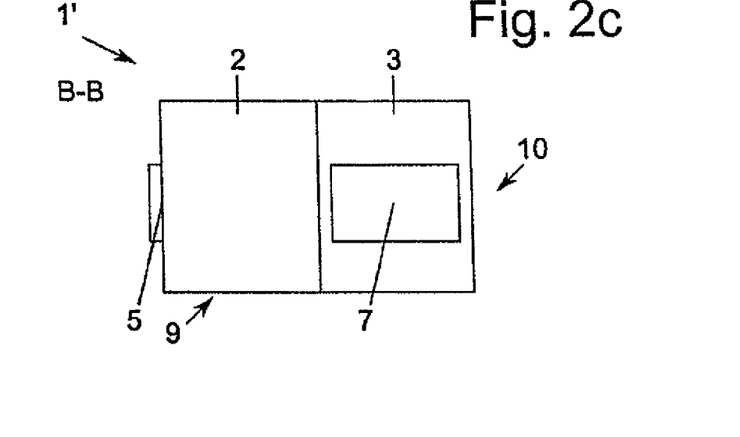

The embodiment according to FIG. 2a differs by the angular arrangement of the modules 9, 10, 11 so that an altered device 1' results. Only the configuration of the primary treatment chamber 3' is altered, since the second primary lock door 7 is not located opposite the first primary lock door 6, but on one side wall of the primary treatment chamber 3'.

In another embodiment of the invention, in the embodiment according to FIGS. 1a and 1b an additional side module (not shown) analagous to the aftertreatment module 11 in FIG. 2a can be located laterally on the primary treatment module 10 in order to remove the damaged wafers which are detected during the process flow from the process sequence.

Figure 3:
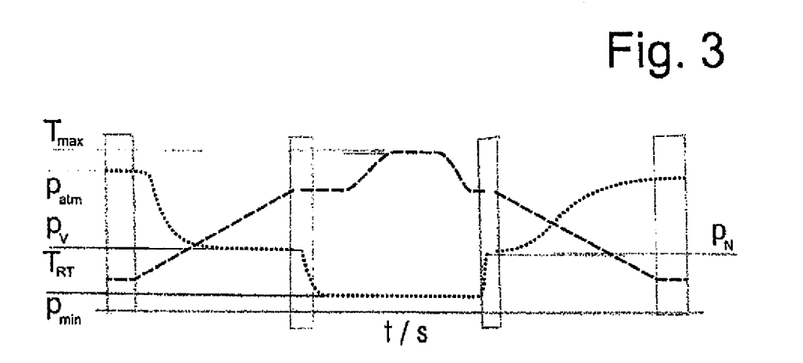

A process sequence in the invention whose pressure and temperature behavior is shown in FIG. 3 proceeds as follows:

The first primary lock door 6 and the second primary lock door 7 are closed. Afterwards the pressure in the primary treatment space 13 is lowered by a pressurization apparatus 104, for example a vacuum pump, especially to a pressure $p_{min}$ less than $10^{-6}$ bar, preferably to a pressure less than $10^{-9}$ bar. This ideally takes place only a single time during the processing of a plurality, especially more than 100, preferably more than 1000, even more preferably more than 10000 wafers or wafer pairs.

Via the opened first lock door 5 a wafer 15 or wafer pair is loaded into the pretreatment chamber by means of the first robot arm 16 and is treated there. Pretreatment can be a dry and/or wet process step, for example wet cleaning, plasma treatment, etching, heating or the like. The pretreatment especially preferably comprises an especially optical and/or mechanical alignment apparatus.

Before or after or during the pretreatment step the pretreatment space 12 can be evacuated via a separately activated pressurization apparatus 104.

Before opening the first primary lock door 6, in any case the first lock door 5 is closed and the pretreatment space 12 is evacuated, especially to a pressure $p_V$, during or shortly prior to the loading of the pretreatment chamber 3 of less than $10^{-6}$ bar, preferably less than $10^{-7}$ bar, so that the pretreatment module 9 acts as a lock for the primary treatment module 10.

The wafer 15 is loaded by an internal transport system, for example a robot arm, through the first primary lock door 6 into the primary treatment chamber 3, 3'.

Then the first primary lock door 6 is closed. During the loading of the primary treatment chamber 3, 3' the second primary lock door 7 is continually closed. The pressure is preferably further lowered to $p_{min}$ less than $10^{-6}$ bar, even more preferably $10^{-9}$ bar.

After closing the first primary lock door 6, another wafer 15 can be loaded into the pretreatment chamber 2. At the same time the primary treatment of the first wafer 15 takes place in the primary treatment module 10. This can be for example bonding, lacquering, imprinting, embossing and/or exposure.

After the primary treatment of the wafer 15 in the primary treatment module 10, the wafer 15 is loaded into the aftertreatment module 11 by opening the second primary lock door 7, the second lock door 8 being closed. Before opening of the second primary lock door 7 the aftertreatment space 14 is exposed to a vacuum, especially a pressure $p_N$ of less than $10^{-6}$, preferably less than $10^{-7}$ by a pressurization apparatus 104 of the aftertreatment module 11 at least until the wafer 15 is loaded from the primary treatment module 10 into the aftertreatment module 11 and the second primary lock door 7 is closed again.

Then aftertreatment of the wafer 15 takes place in the aftertreatment module 11, for example cooling and simultaneous raising of the pressure by the pressurization apparatus 104 of the aftertreatment module 11.

After completion of the aftertreatment of the wafer 15 in the aftertreatment module 11, the wafer 15 is removed via the second lock door 8 and the second robot arm 17.

Before each opening of the primary lock door 6 the pretreatment chamber 2, and before each opening of the primary lock door 7 the aftertreatment chamber 4 are exposed to a pressure $p_V$ or $p_N$ less than the atmospheric and/or ambient pressure $p_{ATM}$ outside the chambers 2, 3, 4 and/or decontaminated, especially flushed with inert gas.

According to one especially advantageous embodiment of the above described invention, the wafer 15 is a wafer pair and a wafer pair is loaded into the device 1 in the above described manner by means of a holding device or handling apparatus for handling of the wafer pair, the pretreatment shown in the left-hand section in FIG. 3 comprising the steps heating, evacuation, gas flushing with reducing gas, a wet chemical treatment, a plasma treatment and/or argon bombardment.

The primary treatment takes place in a vacuum which is higher compared to pretreatment, therefore at a lower pressure $p_{min}$ as is shown in FIG. 3 in the middle section. A controlled gas atmosphere, therefore an exactly set gas pressure and an exactly controlled mixing ratio of gases are set by the pressurization apparatus 104 of the primary treatment module 10. Then the wafer pair is brought into contact and bonded. Beforehand, the temperature which is necessary for the joining, especially $T_{max}$, is set to be greater than 250° C., preferably $T_{max}$ greater than 400° C. During bonding, a force as uniform as possible is applied to the wafer pair and/or an electrical voltage is applied.

The aftertreatment which is shown in FIG. 3 in the right-hand section, takes place in an nonoxidizing environment, in which cooling takes place and the pressure is raised to atmospheric pressure. Slow cooling prevents or avoids thermal stresses in the wafer pair which was bonded beforehand.

Figure 6:
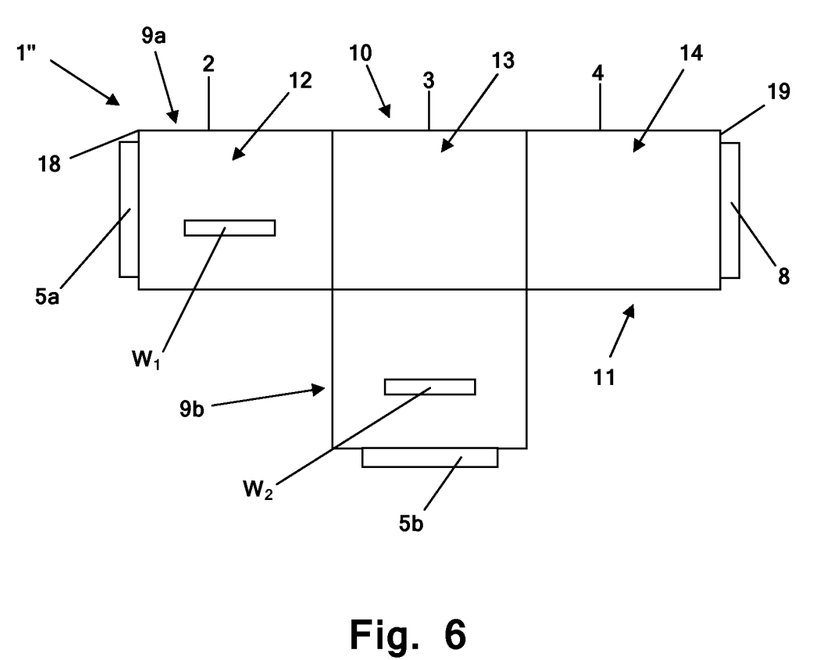
FIG. 6 shows a schematic plan view of an alternative embodiment of the device illustrated in FIG. 1a, wherein the device includes two pretreatment modules for respective pretreatment of first and second wafers or first and second wafer pairs.

The pretreatment of the wafer pair can take place according to an embodiment shown in FIG. 6. Device 1" includes a first pretreatment module 9a for pretreatment of the first wafer $W_1$ or wafer pair and a second pretreatment module 9b for pretreatment of the second wafer $W_2$ or wafer pair. The first and the second wafers $W_1$, $W_2$ can be loaded into the primary treatment chamber via separate lock doors.

The chambers 2, 3, 4 are preferably made of stainless steel or aluminum.

In the embodiment shown in FIG. 4, the first lock door 5 is not located on the face side 18 of the pretreatment chamber 2', but on the side wall. The second lock door 8 is not located on the face side 19, but on the side wall of the aftertreatment chamber 4'.

The process flow is shown by arrows in FIG. 4.

The primary lock doors 6, 7 must accordingly have high pressure tightness up to $p_{min}$ and are preferably made as a transfer valve which is or can be inserted in a common channel between the respectively adjacent chambers 2, 3, 4, forming a seal. The opening diameter of the lock doors 5, 6, 7, 8 is more than 200 mm, especially more than 300 mm, preferably more than 450 mm.

REFERENCE NUMBER LIST 1, 1', 1" device
2, 2' pretreatment chamber
3, 3' primary treatment chamber
4, 4' aftertreatment chamber 5 first lock door
6 first primary lock door
7 second primary lock door
8 second lock door
9 pretreatment module
10 primary treatment module
11 aftertreatment module
12 pretreatment space
13 primary treatment space
14 aftertreatment space
15 wafer
16 first robot arm
17 second robot arm
18 first face side
19 second face side
102 central control apparatus
104 pressurization apparatus

The invention claimed is:

1. A device for processing substrate pairs, wherein each substrate pair is comprised of first and second substrates, the device comprising,
   a first pretreatment module for pretreatment of the first substrate of the substrate pair before primary treatment in at least one primary treatment module, the first pretreatment module including a first pretreatment chamber which forms a first pretreatment space, and a first lock door moveable between an open state and a closed state,
   a second pretreatment module for pretreatment of the second substrate of the substrate pair before primary treatment in the at least one primary treatment module, the second pretreatment module including a second pretreatment chamber which forms a second pretreatment space, and a second lock door moveable between an open state and a closed state,
   said at least one primary treatment module for primary treatment of the substrate pair having a primary treatment chamber which forms a primary treatment space, wherein primary treatment of the substrate pair includes bringing the first and second substrates of the substrate pair into contact with each other and bonding the first and second substrates together while the first and second pretreatment modules are loaded with further substrates, said at least one primary treatment module including a heating apparatus for heating the primary treatment chamber to a temperature that is greater than 250° C. during bonding of the first and second substrates,
   a first primary lock door located between the first pretreatment chamber and the primary treatment chamber, said first primary lock door movable between an open state and a closed state and said first primary lock door forming a vacuum-tight connection between the primary treatment chamber and the first pretreatment chamber in the closed state,
   a second primary lock door located between the second pretreatment chamber and the primary treatment chamber, said second primary lock door moveable between an open state and a closed stated and said second primary lock door forming a vacuum-tight connection between the primary treatment chamber and the second pretreatment chamber in the closed state,
   at least one aftertreatment module for aftertreatment of the substrate pair, the at least one aftertreatment module having:
      an aftertreatment chamber which forms an aftertreatment space, and
      a third lock door movable between an open state and a closed state,
   a third primary lock door located between the primary treatment space and the aftertreatment space, said third primary lock door movable between an open state and a closed state and said third primary lock door forming a vacuum-tight connection between the primary treatment chamber and the aftertreatment chamber in the closed state, and
   a central control apparatus for controlling operation of one or more pressurization apparatus to independently control pressure in the first and second pretreatment spaces, the primary treatment space, and the aftertreatment space, and for controlling movement of the first lock door, the first primary lock door, the second lock door, the second primary lock door, the third lock door, and the third primary lock door, between the open state and the closed state.

2. The device as claimed in claim 1, wherein the first, second, and third primary lock doors are transfer valves.

3. The device as claimed in claim 1, wherein the device includes one or more additional pretreatment modules connected upstream to at least one of the first and second pretreatment modules as locks and/or one or more additional aftertreatment modules connected downstream of the at least one aftertreatment module as locks.

4. A device for processing substrate pairs, wherein each substrate pair is comprised of first and second substrates, the device comprising,
   first and second pretreatment modules, the first pretreatment module for pretreatment of the first substrate of the substrate pair before primary treatment in a primary treatment module having a primary treatment chamber which forms a primary treatment space, and the second pretreatment module for pretreatment of the second substrate of the substrate pair before primary treatment in the primary treatment module, wherein the first and the second substrates are respectively loaded into the primary treatment chamber via separate first and second primary lock doors,
   said primary treatment module for primary treatment of the substrate pair that includes bringing the first and second substrates of the substrate pair into contact with each other and bonding the first and second substrates together while the first and second pretreatment modules are loaded with further substrates, said primary treatment module including a heating apparatus for heating the primary treatment chamber to a temperature that is greater than 250° C. during bonding of the first and second substrates,
   said first primary lock door located between the first pretreatment chamber and the primary treatment chamber, said first primary lock door movable between an open state and a closed state and said first primary lock door forming a vacuum-tight connection between the primary treatment chamber and the first pretreatment chamber in the closed state,
   said second primary lock door located between the second pretreatment chamber and the primary treatment chamber, said second primary lock door moveable between an open state and a closed stated and said second primary lock door forming a vacuum-tight connection between the primary treatment chamber and the second pretreatment chamber in the closed state,
   at least one aftertreatment module for aftertreatment of the substrate pair, the at least one aftertreatment module having:

an aftertreatment chamber which forms an aftertreatment space, and
a third lock door movable between an open state and a closed state,
a third primary lock door located between the primary treatment space and the aftertreatment space, said third primary lock door movable between an open state and a closed state and said third primary lock door forming a vacuum-tight connection between the primary treatment chamber and the aftertreatment chamber in the closed state, and
a central control apparatus for controlling operation of one or more pressurization apparatus to independently control pressure in the first and second pretreatment spaces, the primary treatment space, and the aftertreatment space, and for controlling movement of the first lock door, the first primary lock door, the second lock door, the second primary lock door, the third lock door, and the third primary lock door, between the open state and the closed state.

5. The device as claimed in claim 1, wherein the device further comprises:
a loading and unloading apparatus for loading and unloading of the first and second substrates into and out of the primary treatment chamber and/or the first pretreatment chamber and/or the second pretreatment chamber and/or the aftertreatment chamber.

6. The device as claimed in claim 1, wherein the central control apparatus controls operation of a loading and unloading apparatus for loading and unloading the first and second substrates into and out of the pretreatment, primary treatment and aftertreatment chambers, wherein
the primary treatment chamber is loaded from the first pretreatment chamber via the first primary lock door and the primary treatment chamber is unloaded into the aftertreatment chamber via the third primary lock door, at the same time and/or
the first pretreatment chamber is loaded via the first lock door and the aftertreatment chamber is unloaded via the third lock door, at the same time.

7. The device as claimed in claim 2, wherein the first, second, and third primary lock doors are inserted in a common channel located between the respectively adjacent pretreatment and aftertreatment chambers to form a seal therebetween.

8. The device as claimed in claim 5, wherein the loading and unloading apparatus comprises at least one robot arm.

9. The device as claimed in claim 1, wherein said device includes a first pressurization apparatus connected to the first pretreatment chamber for pressurizing the first pretreatment space, a second pressurization apparatus connected to the second pretreatment space for pressurizing the second pretreatment space, a third pressurization apparatus connected to the primary treatment chamber for pressurizing the primary treatment space, and a fourth pressurization apparatus connected to the aftertreatment chamber, for pressurizing the aftertreatment space.

10. The device as claimed in claim 1, wherein said first and second substrates are wafers.

11. The device as claimed in claim 4, wherein the first, second and third primary lock doors are transfer valves.

12. The device as claimed in claim 4, wherein the device includes one or more additional pretreatment modules connected upstream to at least one of the first and second pretreatment modules as locks and/or one or more additional aftertreatment modules connected downstream of the at least one aftertreatment module as locks.

13. The device as claimed in claim 4, wherein the device further comprises:
a loading and unloading apparatus for loading and unloading of the first and second substrates into and out of the primary treatment chamber and/or the first pretreatment chamber and/or the second pretreatment chamber and/or the aftertreatment chamber.

14. The device as claimed in claim 4, wherein the central control apparatus controls operation of a loading and unloading apparatus for loading and unloading the first and second substrates into and out of the pretreatment, primary treatment and aftertreatment chambers, wherein
the primary treatment chamber is loaded from the first pretreatment chamber via the first primary lock door and the primary treatment chamber is unloaded into the aftertreatment chamber via the third primary lock door, at the same time and/or
the first pretreatment chamber is loaded via the first lock door and the aftertreatment chamber is unloaded via the third lock door, at the same time.

15. The device as claimed in claim 4, wherein the first, second, and third primary lock doors are inserted in a common channel located between the respectively adjacent pretreatment and aftertreatment chambers to form a seal therebetween.

16. The device as claimed in claim 4, wherein the loading and unloading apparatus comprises at least one robot arm.

17. The device as claimed in claim 4, wherein said device includes a first pressurization apparatus connected to the first pretreatment chamber for pressurizing the first pretreatment space, a second pressurization apparatus connected to the second pretreatment space for pressurizing the second pretreatment space, a third pressurization apparatus connected to the primary treatment chamber for pressurizing the primary treatment space, and a fourth pressurization apparatus connected to the aftertreatment chamber, for pressurizing the aftertreatment space.

18. The device as claimed in claim 4, wherein said first and second substrates are wafers.

* * * * *